United States Patent [19]

Glasl et al.

[11] 4,109,273

[45] Aug. 22, 1978

[54] CONTACT ELECTRODE FOR SEMICONDUCTOR COMPONENT

[75] Inventors: Andreas Glasl, Haar; Helmuth Murrmann, Ottobrunn, both of Germany

[73] Assignee: Siemens Aktiengesellschaft, Berlin & Munich, Germany

[21] Appl. No.: 811,267

[22] Filed: Jun. 29, 1977

Related U.S. Application Data

[63] Continuation of Ser. No. 603,938, Aug. 12, 1975, abandoned.

[30] Foreign Application Priority Data

Aug. 16, 1974 [DE] Fed. Rep. of Germany ....... 2439408

[51] Int. Cl.$^2$ ................... H01L 29/72; H01L 27/02; H01L 27/12
[52] U.S. Cl. ....................................... 357/35; 357/40; 357/49; 357/59; 357/65
[58] Field of Search ................ 357/40, 49, 59, 65, 357/35, 36

[56] References Cited

U.S. PATENT DOCUMENTS

| 3,456,335 | 7/1969 | Hennings et al. | 357/49 |
| 3,717,514 | 2/1973 | Burgess | 357/65 |
| 3,806,361 | 4/1974 | Lehner | 357/65 |
| 3,847,687 | 11/1974 | Davidsohn | 357/65 |
| 4,005,453 | 1/1977 | Lecan et al. | 357/49 |
| 4,008,107 | 2/1977 | Hayasaka et al. | 357/49 |

OTHER PUBLICATIONS

Quadratpilze aus Polysilizium, published 6–74.
Geues aus der Technik, nr. 3, vom. 15 6/74.

Primary Examiner—Andrew J. James
Attorney, Agent, or Firm—Hill, Gross, Simpson, Van Santen, Steadman, Chiara & Simpson

[57] ABSTRACT

A semiconductor device having one or more electrodes thereon composed of doped polycrystalline silicon. Initially undoped polycrystalline silicon is applied at select electrode positions of a semiconductor device and is then doped by diffusion or implantation. The resultant device is characterized by a high current amplification, a low inner path of resistance and low noise.

1 Claim, 4 Drawing Figures

CONTACT ELECTRODE FOR SEMICONDUCTOR COMPONENT

This is a continuation, of application Ser. No. 603,938, filed Aug. 12, 1975, now abandoned.

BACKGROUND OF THE INVENTION

1. Field of the Invention

The invention relates to a semiconductor device or element having at least two zones of different conductivity type therein, each of which are respectively provided with an electrode, such as for an integrated circuit.

2. Prior Art

Our copending U.S. Ser. No. 587,996, filed June 18, 1975 assigned to the instant assignee and which is incorporated herein by reference, discloses and claims a method of producing a doped zone of a select conductivity type in a semiconductor member whereby an initially undoped polycrystalline semiconductor layer is deposited on a surface of the zone to be doped and a dopant producing the select conductivity type in such zone is diffused through the polycrystalline semiconductor layer into the semiconductor member.

Such a method differs from the so-called "DOPOS" technique which uses doped polycrystalline silicon as a dopant source in producing an emitter (see M. Takagi et al, "Improvement of Shallow Base Transistor Technology By Using A Doped Poly-Silicon Diffusion Source", Proceedings of the 4th Conference on Solid State Devices, Tokyo, 1972, pages 101–109). It should be noted that the use of undoped poly-silicon which is subsequently doped yields transistors and the like with better properties (for example, higher current amplification, lower inner path resistance, lower noise, etc.).

SUMMARY OF THE INVENTION

The invention provides a semiconductor device having at least two zones of different conductivity type therein, with each of such zones having an electrode thereon for an integrated circuit. The semiconductor device constructed in accordance with the principle of the invention is extremely compact and the elements thereof are of very small dimension, rendering such elements suitable for integration. In instances where the semiconductor device of the invention is formed as a transistor, an extremely desirable transistor results because of high current amplification and great emitter yield.

In accordance with the principles of the invention, at least one electrode on a semiconductor device of the type described above, consists of initially undoped polycrystalline silicon (poly-silicon) which is subsequently doped, for example by diffusion or implantation.

In one embodiment of the invention, a transistor is provided having an emitter electrode consisting of initially undoped poly-silicon which is doped subsequent to the completion of the transistor by diffusion or implantation.

In another embodiment of the invention, the semiconductor device includes an emitter zone having a very large yield with a Gummel number $G_E$ greater than $1 \times 10^{14}$ s cm$^{-4}$ and preferably greater than $3 \times 10^{14}$ s cm$^{-4}$ wherein the Gummel number is defined by the relation $$G_E = \int_0^{X_E} \frac{N_{\it{eff}}^{(x)} dx}{D_p^{(x)}}$$

wherein $N_{\it{eff}}^{(x)}$ is the effective doping of the emitter zone between a contact electrode ($x = 0$) and the emitter penetration depth $x_E$; and $D_p^{(x)}$ is the diffusion coefficient of holes in an n-doped emitter zone (npn transistor).

By following the principles of the invention one may produce transistors and like semiconductor elements which require a very small surface area on a semiconductor member and which have a high current amplification even though the base doping below the emitter zone is high. The emitter yield is substantially increased in relation to prior art devices. The so-called Gummel number function to define the emitter yield and values of $3 \times 10^{14}$ s cm$^{-4}$ are attainable in transistors constructed in accordance with the principles of the invention, as compared with typical prior art Gummel values of $2 \times 10^{13}$ s cm$^{-4}$. (These values are based on emitter widths of 3 to 4 μm).

In relation with a high current amplification, a large base doping causes the maximum of the current amplification or the boundary frequency, respectively, to be shifted toward higher emitter currents, approximately by a factor of 5. As compared to typical prior art transistors, this allows emitter lengths of the same current capacity to be shortened by approximately a factor of 5. Accordingly, in semiconductor devices of the invention, the emitter/base capacitance decreases and simultaneously, because of the resultant surface decrease of the base zone, the base/collector capacitance or collector/substrate capacitance also decreases.

In another embodiment of the invention, the base zone of a semiconductor device is limited or defined by a pair of spaced-apart oxide layers or walls abutting to side surfaces of the base zone and having face surfaces thereof located perpendicularly to a plane containing the emitter electrode of such a device. With the use of this so-called "oxide-isolation technique" substantially smaller transistors and the like may be provided for use in integrated circuits.

DESCRIPTION OF PREFERRED EMBODIMENTS

Figure 1:
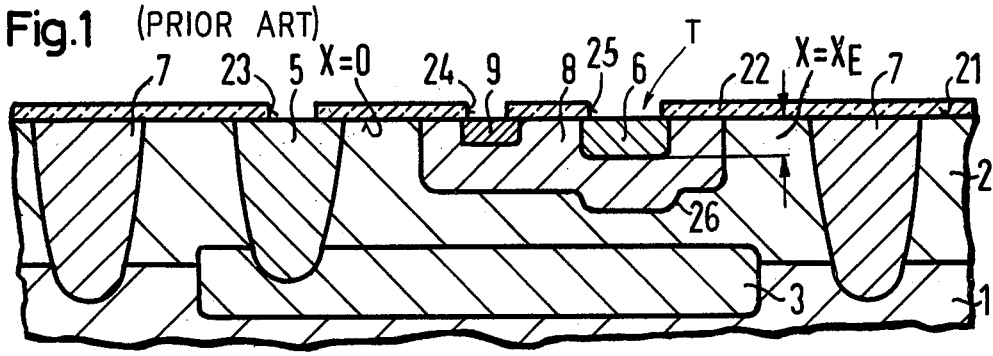
FIG. 1 is a partial cross-sectional elevated view of a prior art transistor.

In the drawings, like reference numerals have been utilized to designate like parts.

In FIG. 1 an epitaxially deposited n-conductive semiconductor layer 2 is provided on a p-conductive semiconductor substrate 1. A highly doped n$^+$-conductive zone 3 may be positioned below a transistor T at the surface boundry between the layer 2 and the substrate 1. The zone 3 functions as a "buried layer". The transistor T comprises an n$^+$-conductive emitter zone 6 and a p-conductive base zone 8 which includes a base terminal area 9 wherein the collector zone for such a transistor is the semiconductor layer 2 between a pair of spaced-apart p-conductive insulation walls 7. An n+-conductive zone 5 spaced from the walls or zones 7 may be provided for contacting zone 3. A SiO$_2$ layer 22, having windows 23, 24 and 25 respectively providing access to the collector zone 3, the base zone 8 and the emitter zone 6, is positioned on the face surface 21 of the semiconductor layer 2. Later a metal contact electrode may be positioned in each of such windows (but which has not been illustrated in order to simplify the drawings). As can be seen from FIG. 1, the base zone 8 includes a bulge or widening 26 below the emitter zone 6. Such a base zone widening results from the so-called "emitter-dip effect" and causes a disadvantageous frequency and balance behaviour.

Figure 2:
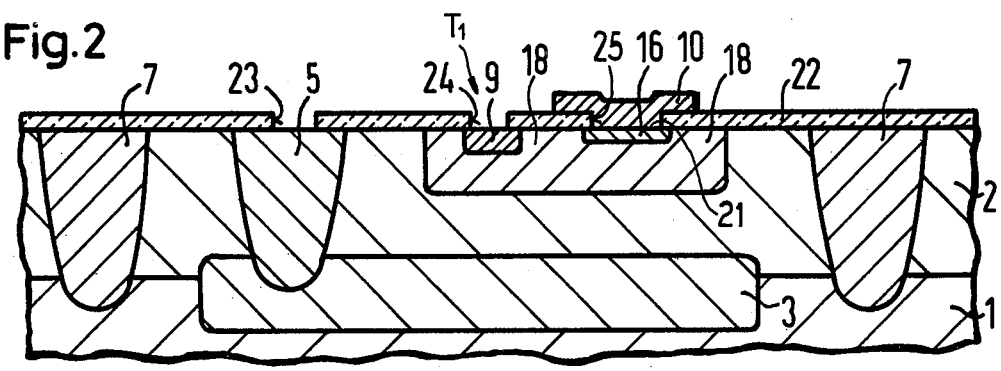
FIGS. 2 through 4 are somewhat similar views of different embodiments of transistors in a semiconductor device constructed in accordance with the principles of the invention.

FIG. 2 illustrates a transistor T$_1$ constructed in accordance with the principles of the invention and which differs from the prior art transistor T (FIG. 1) primarily in that transistor T$_1$ includes an emitter electrode 10 consisting of initially undoped poly-silicon (polycrystalline silicon), which is subsequently doped by diffusion or implantation. Additionally, the emitter zone 16 of transistor T$_1$ has a subsantially lower or shallower penetration depth in the monocrystal in relation to emitter zone 6 of the prior art transistor T. Further, the base zone 18 of transistor T$_1$ does not include a bulge or widening below the emitter zone, such as is present at widening 26 of base zone 8 in the prior art transistor T.

A transistor such as T$_1$ shown at FIG. 2 may be produced by conventional techniques, with the exception of production of the emitter zone 16. The zone 5, 7, 9 and 18 are all added with conventional masking techniques and placed into the epitaxially deposited semiconductor layer 2. Previous to these steps, zone 3 may also be diffused into the semiconductor substrate 1 with the aid of masking techniques. Of course, one may also produce the individual zone by ion implantation or by other suitable methods.

Figure 3:
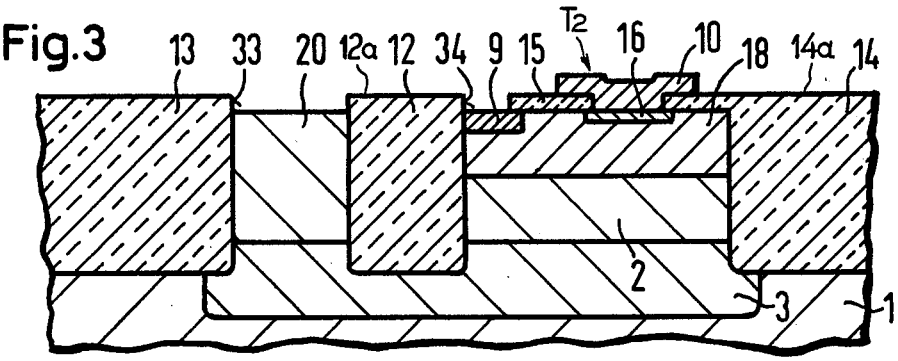
Figure 4:
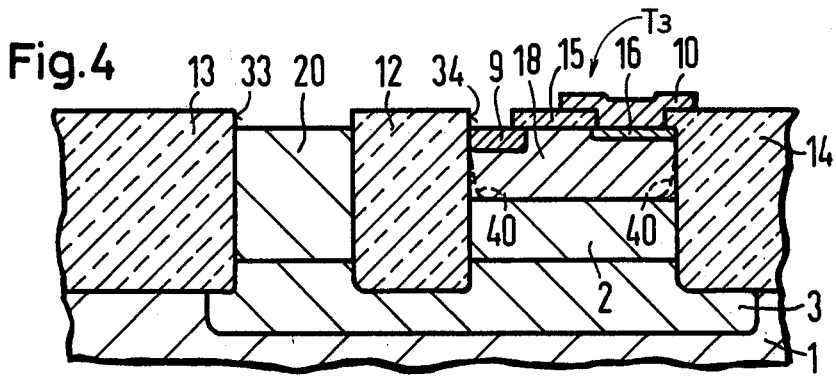

However, it is important that the doping of the emitter zone 16 is effected through initially undoped polycrystalline silicon with a layer thereof positioned at a location of the emitter zone where an electrode 10 is desired. This requires application of an undoped layer of polycrystalline silicon onto the surface 21 of base zone 18 accessible through window 25 before the doping, as by diffusion, of the emitter zone 16. Thereafter, doping, via diffusion, of the emitter zone is effected through the emitter electrode 10. Similarly, doping of the emitter zone may be effected by implantation. In a similar manner, the transistor T$_2$ and T$_3$ illustrated at FIG. 3 and 4 are likewise produced. The penetration depth of such emitter zones is maintained extremely small or shallow. Generally, such an emitter zone has a penetration depth of less than approximately 0.1 μm in the underlying crystal, and such emitter zone preferably has a penetration depth in the range of about 0.2 to 0.7 μm in the base zone contiguous and below such emitter zone. Our earlier noted copending application discloses methods of applying undoped polycrystalline silicon layers and methods of controlling doping zones beneath such layers so that should further details in this regard be required, reference may be made to such copending application.

The exemplary embodiments shown at FIGS. 3 and 4 differ from the exemplary embodiments of FIG. 2 in that SiO$_2$ layers 13 and 14 are included for insulating adjacent elements of a semiconductor device. The layers 13 and 14 replace the pn-walls or zones 7 in the prior art device shown at FIG. 1, and together with the semiconductor substrate 1 define an electrical enclosure about each element of an integrated circuit. As shown, the base zone 18 of an embodiment such as illustrated at FIG. 3 is defined or limited by the SiO$_2$ layers 12 and 14 which have face surfaces 12a and 14a respectively located perpendicularly to the plane containing the emitter electrode 10. In the embodiment shown at FIG. 4, the emitter zone 16 is also limited or defined at least at one side thereof by a SiO$_2$ layer 14. This embodiment also includes a SiO$_2$ layer 15 to insulate the emitter electrode 10 from the base zone 18 in a conventional manner. The electrical connection to the collector zone 2 (limited by side surfaces of the oxide layers 12 and 14) is effected through a highly doped n+-conductive zone 20 via the n+-conductive zone 3. Such collector zone comprises the semiconductor layer 2 isolated between the SiO$_2$ layers 12 and 14.

In the exemplary embodiment shown at FIGS. 3 and 4, the base zone 18 (which has a penetration depth in the range of about 0.2 to 0.7 μm) includes a base contact in a first contact window 34 and the collector zone includes a collector contact in a second contact window 33 so that the contacts are limited by the SiO$_2$ layers 12 or 13 or 14 respectively, which simultaneously function as insulation means. In addition, the emitter zone 16 and the emitter electrode 10 are limited at least at one side thereof by the SiO$_2$ layer 14.

As can be seen from the exemplary embodiments illustrated, an oxide wall or limitation allows extremely small structures or elements to be attained so that a semiconductor element constructed in accordance with the principles of the invention is particularly useful in integration.

The relatively shallow penetration depth of the emitter zone prevents a short circuit between the emitter and the collector zone, such as may occur in the case of an oxide-limited emitter zone when such emitter zone has a normal penetration depth, such as shown in FIG. 1. This short circuit, which occurs because of the pn-junction between the base zone 8 and the collector zone 2 between the insulating walls 7 in the structure shown at FIG. 1, is avoided in structures of the invention because the pn-junction between the base zone 18 (FIGS. 3 or 4) and the collector zone 2 at the boundary of the SiO$_2$ layers 12 and 14 is somewhat bent upwardly due to the "pile-down" effect, which has been schematically shown by the dotted line 40 in FIG. 4. The polycrystalline emitter electrode 10 with its very shallow penetration depth (emitter zone 16) thus permits the oxide boundry to touch the emitter which entails very small dimensions.

With the foregoing general discussion in mind, there is now presented a detailed example which includes a comparison between select pertinent properties of a prior art transistor having the construction shown at FIG. 1 and transistors of the invention having the construction shown at FIGS. 2 through 4 and which will illustrate to those skilled in the art the manner in which this invention may be carried out and which will illustrate at least some of the advantages realized by practicing the invention. However, the example is not to be construed as limiting the scope of the invention in any way.

A plurality of transistors were constructed in accordance with FIGS. 1 through 4 and the transistor surface area $F_T$, the base surface area $F_B$, the emitter surface area $F_E$, the base capacitance $C_B$, the emitter capacitance $C_E$, the base zone resistance $R_E$ and the collector zone resistance $R_C$ were measured and the results are summarized below in Table I. In these exemplary transistors, the base zone had a layer-resistance value of 500 ohm/□ (ohms per square) and had a penetration depth of about 0.7 μm.

TABLE I

| Transistor Structure in Accordance With | $F_T$ [μm²] | $F_B$ [μm²] | $F_E$ [μm²] | $C_B$ [pF] | $C_E$ [pF] | $R_B$ [Ω] | $R_C$ [Ω] |
|---|---|---|---|---|---|---|---|
| Fig. 1 | 2.100 | 440 | 48 | 0.16 | 0.12 | 200 | 40 |
| Fig. 2 | 1.700 | 260 | 16 | 0.095 | 0.05 | 400 | 100 |
| Fig. 3 | 750 | 215 | 16 | 0.080 | 0.05 | 400 | 100 |
| Fig. 4 | 410 | 60 | 16 | 0.022 | 0.04 | 1.000 | 200 |

As is apparent from the foregoing specification, the present invention is susceptible of being embodied with various alterations and modifications which may differ particularly from those that have been described in the preceding description. For this reason, it is to be fully understood that all the foregoing is intended to be merely illustrative of the principles of the invention and it is not to be construed or interpreted as being restrictive or otherwise limiting of the invention, excepting as it is set forth and defined in the hereto-appended claims.

We claim as our invention:

1. In a semiconductor device comprised of at least two zones of different conductivity type, each of which is provided with at least one electrode for an integrated circuit, the improvement comprising:
wherein one electrode is an emitter electrode consisting of an initially undoped polycrystalline silicon which is subsequently implantation or diffusion doped;
an emitter zone located below and contiguous with said emitter electrode, said emitter zone having a penetration depth in the range of about 0.2 to 0.7 μm;
a base zone located at least partially below said emitter zone and spaced from said emitter electrode, said base zone having a penetration depth in the range of about 0.2 to 0.7 μm;
a collector zone located below and contiguous with said emitter zone;
a buried layer located at least partially below and partially contiguous with said collector zone;
a pair of spaced-apart oxide layers having face surfaces located perpendicularly to the plane containing said emitter electrode, said spaced-apart oxide layers abutting to side surfaces of said base zone and side surfaces of said collector zones, at least one of said spaced-apart oxide layers abutting to a side surface of said emitter zone; and
a relatively highly conductive zone located between said emitter electrode and one of said spaced-apart oxide layers and in contact with said buried layer.

* * * * *